(12) United States Patent
Funayama et al.

(10) Patent No.: US 9,231,150 B2
(45) Date of Patent: Jan. 5, 2016

(54) PHOSPHOR FOR LIGHT EMITTING DEVICE AND METHOD FOR MANUFACTURING THE SAME, AND LIGHT EMITTING DEVICE USING THE SAME

(71) Applicants: KABUSHIKI KAISHA TOSHIBA, Tokyo (JP); TOSHIBA MATERIALS CO., LTD., Yokohama-Shi (JP)

(72) Inventors: Yoshitaka Funayama, Yokohama (JP); Hirofumi Takemura, Kamakura (JP)

(73) Assignees: KABUSHIKI KAISHA TOSHIBA, Tokyo (JP); TOSHIBA MATERIALS CO., LTD., Yokohama-Shi (JP)

( * ) Notice: Subject to any disclaimer, the term of this patent is extended or adjusted under 35 U.S.C. 154(b) by 119 days.

(21) Appl. No.: 14/026,635

(22) Filed: Sep. 13, 2013

(65) Prior Publication Data
US 2014/0008690 A1    Jan. 9, 2014

Related U.S. Application Data

(63) Continuation of application No. PCT/JP2012/001653, filed on Mar. 9, 2012.

(30) Foreign Application Priority Data

Mar. 16, 2011   (JP) .................................. 2011-057880

(51) Int. Cl.
*H01L 33/50* (2010.01)
*H01L 33/00* (2010.01)
(Continued)

(52) U.S. Cl.
CPC ............ *H01L 33/005* (2013.01); *C09K 11/642* (2013.01); *C09K 11/7734* (2013.01); *C09K 11/7789* (2013.01); *H01L 33/502* (2013.01); *H05B 33/145* (2013.01)

(58) Field of Classification Search
CPC ........................................................ H01L 33/50
USPC .............................................................. 257/98
See application file for complete search history.

(56) References Cited

U.S. PATENT DOCUMENTS 6,576,156 B1 *  6/2003  Ratna et al. ............ 252/301.4 R
8,574,459 B2   11/2013  Seto et al.
(Continued)

FOREIGN PATENT DOCUMENTS

CN        1444775        9/2003
CN       101481614       7/2009
(Continued)

OTHER PUBLICATIONS

English Translation of International Preliminary Report on Patentability for PCT/JP2012/001653, and Written Opinion of the International Searching Authority.
(Continued)

*Primary Examiner* — Matthew W Such
*Assistant Examiner* — Warren H Kilpatrick
(74) *Attorney, Agent, or Firm* — Harness, Dickey & Pierce, PLC

(57) ABSTRACT

A phosphor for light emitting device of an embodiment includes: a phosphor particle composed of at least one selected from an alkaline earth silicate phosphor, a lanthanum oxysulfide phosphor, and a zinc sulfide phosphor; and a surface treatment agent, provided to cover a surface of the phosphor particle, of at least one selected from a silane coupling agent and an acrylic emulsion. A luminance maintenance ratio of the phosphor represented by a formula: luminance B/luminance A×100(%), is 98% or more, wherein the luminance A is a luminance of the phosphor made to emit under a condition of temperature: 23° C., humidity: 40%, and the luminance B is a luminance of the phosphor made to emit under a condition of temperature: 23° C., humidity: 40% after leaving the phosphor under a condition of temperature: 60° C., humidity: 90% for 12 hours.

11 Claims, 2 Drawing Sheets

(51) Int. Cl.
*C09K 11/64* (2006.01)
*C09K 11/77* (2006.01)
*H05B 33/14* (2006.01)

(56) References Cited

U.S. PATENT DOCUMENTS

| | | | |
|---|---|---|---|
| 8,828,272 | B2 | 9/2014 | Seto et al. |
| 2004/0056256 | A1 | 3/2004 | Bokor et al. |
| 2006/0055315 | A1 | 3/2006 | Bokor et al. |
| 2007/0170842 | A1 | 7/2007 | Bokor et al. |
| 2008/0103276 | A1 | 5/2008 | Choi et al. |
| 2008/0173886 | A1* | 7/2008 | Cheon et al. ............ 257/98 |
| 2009/0072255 | A1* | 3/2009 | Takahashi et al. ........ 257/98 |
| 2009/0174841 | A1 | 7/2009 | You et al. |
| 2010/0322275 | A1 | 12/2010 | Ishii et al. |
| 2011/0006325 | A1 | 1/2011 | Ishii et al. |
| 2012/0193667 | A1 | 8/2012 | Choi et al. |
| 2012/0256533 | A1 | 10/2012 | Seto et al. |
| 2014/0042898 | A1 | 2/2014 | Seto et al. |

FOREIGN PATENT DOCUMENTS

| | | |
|---|---|---|
| EP | 2088181 | 8/2009 |
| JP | 10298544 | 11/1998 |
| JP | 2002188084 | 7/2002 |
| JP | 2002188085 | 7/2002 |
| JP | 2002308892 | 10/2002 |
| JP | 2004505470 | 2/2004 |
| JP | 2005-187628 | 7/2005 |
| JP | 2005286351 | 10/2005 |
| JP | 2007161748 | 6/2007 |
| JP | 2008-111112 | 5/2008 |
| JP | 2009161759 | 7/2009 |
| KR | 100898288 | 5/2009 |
| KR | 20090096543 | 9/2009 |
| KR | 20100086051 | 7/2010 |
| WO | 2002011214 | 7/2002 |
| WO | 2008096545 | 8/2008 |
| WO | 2009072539 | 11/2009 |
| WO | WO2010/114061 A1 | 7/2010 |

OTHER PUBLICATIONS

International Search Report and Written Opinion (in English) of the International Searching Authority mailed Jun. 12, 2012, in corresponding PCT/JP2012/001653 application.

* cited by examiner

PHOSPHOR FOR LIGHT EMITTING DEVICE AND METHOD FOR MANUFACTURING THE SAME, AND LIGHT EMITTING DEVICE USING THE SAME

CROSS-REFERENCE TO RELATED APPLICATIONS

This application is a continuation of prior International Application No. PCT/JP2012/001653 filed on Mar. 9, 2012, which is based upon and claims the benefit of priority from Japanese Patent Application No. 2011-057880 filed on Mar. 16, 2011; the entire contents of all of which are incorporated herein by reference.

FIELD

Embodiments described herein relate generally to a phosphor for light emitting device and a method for manufacturing the same, and a light emitting device using the same.

BACKGROUND ART

A light emitting device using a light emitting diode (LED) is broadly used for a lighting system such as a backlight of a liquid crystal display apparatus, a signal apparatus, switches, a lamp for vehicle, or a general lighting. In particular, a white light emitting type LED lamp (white LED lamp) made by combining an LED and a phosphor attracts attention, in addition to as a backlight of a liquid crystal display apparatus or a lamp for vehicle, as a substitute of a lighting system using a white lamp, a fluorescent lamp, or the like and its practical application as a white lighting system is being proceeded.

As the white LED lamp, there are known an LED lamp made by combining an LED chip emitting blue light and a yellow phosphor, an LED lamp made by combining an LED chip emitting blue light, a green to yellow phosphor, and a red phosphor, an LED lamp made by combining an LED chip emitting ultraviolet to violet light with an emission wavelength of about 360 to 440 nm and a mixture (BGR or BYR phosphor) of respective blue, green to yellow, and red phosphors, and so on. As the green to yellow phosphor used for the white LED lamp, there is known an europium (Eu) and manganese (Mn)-activated alkaline earth silicate phosphor such as $(Sr, Ba, Mg)_2SiO_4$:Eu, Mn.

Though the white LED lamp made by combining the LED chip emitting blue light, the green to yellow phosphor, and the red phosphor is superior to the white LED lamp made by combining the LED chip emitting blue light and the yellow phosphor in a light emission efficiency and a color rendering property, but has a flaw of being inferior in a weather resistance. In particular, under a high-temperature/high-humidity environment, deterioration of a luminance of the white LED lamp becomes notable. The above is considered to be derived from Eu and Mn-activated alkaline earth silicate phosphor used as the green to yellow phosphor. Also in the white LED lamp made by combining the LED chip emitting ultraviolet to violet light and the BGR or BYR phosphor, reduction of a weather resistance becomes a problem when the Eu and Mn-activated alkaline earth silicate phosphor is used as the green to yellow phosphor.

Also inferior in the weather resistance are an europium (Eu) and samarium (Sm)-activated lanthanum oxysulfide phosphor such as $La_2O_2S$:Eu,Sm used as a red phosphor, a copper (Cu) and aluminum (Al)-activated zinc sulfide phosphor such as ZnS:Cu,Al used as a green phosphor, and a silver (Ag) and aluminum (Al)-activated zinc sulfide phosphor such as ZnS:Ag, Al used as a blue phosphor. Luminance deterioration of the white LED lamps becomes a problem also in a case that the above phosphors are used. In order to improve a luminance maintenance ratio under a high-temperature/high-humidity environment of a light emitting device such as a white LED lamp, it is required to heighten weather resistance of an alkaline earth silicate phosphor used as a green to yellow phosphor, a lanthanum oxysulfide phosphor used as a red phosphor, and a zinc sulfide phosphor used as a green phosphor or a blue phosphor.

DETAILED DESCRIPTION

Figure 1:
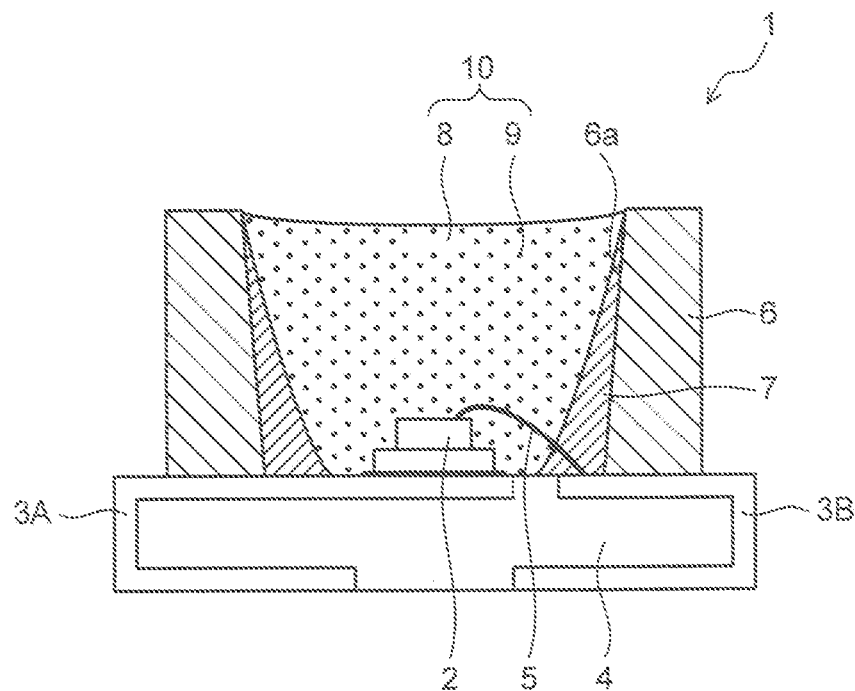
FIG. 1 is a cross-sectional view showing a light emitting device according to a first embodiment.

A phosphor of an embodiment is a phosphor used for a light emitting device which has an LED chip emitting ultraviolet to blue light as an excitation source of the phosphor, the phosphor including: a phosphor particle composed of at least one selected from an alkaline earth silicate phosphor, a lanthanum oxysulfide phosphor, and a zinc sulfide phosphor; and a surface treatment agent of at least one selected from a silane coupling agent and an acrylic emulsion, the surface treatment agent being provided to cover a surface of the phosphor particle. A luminance maintenance ratio of the phosphor is 98% or more, wherein the luminance maintenance ratio is represented by a formula:

$$\text{luminance } B/\text{luminance } A \times 100 (\%),$$

the luminance A is an initial luminance obtained by making the phosphor emit under a condition of a temperature of 23° C. and a humidity of 40%, and the luminance B is a luminance obtained by making the phosphor emit under a condition of a temperature of 23° C. and a humidity of 40% after leaving the phosphor under a condition of a temperature of 60° C. and a humidity of 90% for 12 hours.

Hereinafter, phosphors for light emitting device according to embodiments will be described. The phosphor for light emitting device of the embodiment includes a phosphor particle and a surface treatment agent provided to cover a surface thereof. The phosphor particle is composed of at least one selected from an alkaline earth silicate phosphor, a lanthanum oxysulfide phosphor, and a zinc sulfide phosphor. The surface treatment agent is composed of at least one selected from a silane coupling agent and an acrylic emulsion.

The alkaline earth silicate phosphor, the lanthanum oxysulfide phosphor, and the zinc sulfide phosphor are inferior in a weather resistance by themselves. The phosphor for light emitting device according to the embodiment is one whose weather resistance is improved by covering the surface of the above-described phosphor particle with a film of the surface treatment agent of at least one selected from the silane coupling agent and the acrylic emulsion. Hereinafter, concrete constitutions of the phosphor particle and the surface treatment agent will be described.

As the alkaline earth silicate phosphor, there is cited a phosphor whose main body (phosphor host) is an alkaline earth orthosilicate such as $(Sr, Ba, Mg)_2SiO_4$, for example, the phosphor host being activated with europium (Eu) and manganese (Mn). The Eu and Mn-activated alkaline earth silicate phosphor such as $(Sr, Ba, Mg)_2SiO_4:Eu,Mn$ is a green to yellow phosphor which absorbs ultraviolet to blue light emitted from an LED chip and emits green to yellow light. The Eu and Mn-activated alkaline earth silicate phosphor can adjust an emission color based on a composition ratio of alkaline earth metal (Sr, Ba, Mg) of the phosphor host.

For example, in an Eu-activated strontium silicate phosphor $(Sr_2SiO_4:Eu)$, by substituting Ba for part of Sr in a range of 0.1 to 1.7 mol, a light emission intensity of a yellow color region can be changed. By substituting Mg for part of Sr in a range of 0.01 to 0.15 mol, a light emission intensity of a blue color region can be changed, and further, by substituting Mn in a range of 0.001 to 0.01 mol, a light emission intensity of a red color region can be changed. As described above, it is possible to arbitrarily increase/decrease a light emission spectrum of each wavelength region based on a composition ratio of the alkaline earth metal (Sr, Ba, Mg) and manganese (Mn).

A lower limit value of a content of each substitution element described above is set as a range in which an effective light emission spectrum change amount can be obtained, and if the content is less than the lower limit value, the light emission spectrum is not able to be changed effectively. On the other hand, an upper limit value of the content of each substitution element is set so that a sufficient light emission spectrum change amount can be obtained and in consideration of a concentration balance among the respective elements, and if the content exceeds the upper limit value, the concentration balance or the like is reduced and a desired emission color is not able to be obtained. Further, it is preferable that a mole ratio of Mg is larger than a mole ratio of Mn. If the mole ratio of Mn is larger than the mole ratio of Mg, a phosphor powder (crystal powder) obtained thereby is colored and brightness is reduced.

Eu is an activator (main activator) being a light emission center. Since Eu has a high transition probability, a light emission efficiency of an alkaline earth silicate phosphor can be heightened by activating the alkaline earth silicate being a phosphor host with Eu. It is preferable that Eu being the main activator is contained by being substituted for part of Sr in a range of 0.025 to 0.25 mol. It is more preferable that a substitution amount (content ratio) of Eu for Sr is in a range of 0.05 to 0.2 mol. When the content ratio of Eu is out of the above-described range, an emission luminance or an emission chromaticity is reduced.

It is preferable that the Eu and Mn-activated alkaline earth silicate phosphor is a green to yellow phosphor which absorbs ultraviolet to blue light emitted from an LED chip and emits green to yellow light, the green to yellow phosphor having a composition represented by a general formula:

$$(Sr_{2-x-y-z-u}Ba_xMg_yEu_zMn_u)SiO_4 \quad (1)$$

Wherein x, y, z, and u are numerals (atomic ratio) satisfying $0.1 \leq x \leq 1.7$, $0.01 \leq y \leq 0.15$, $0.025 \leq z \leq 0.25$, and $0.001 \leq u \leq 0.01$.

As the lanthanum oxysulfide phosphor, there is cited a phosphor whose main body (phosphor host) is a lanthanum oxysulfide $(La_2O_2S)$, the phosphor host being activated with europium (Eu) and samarium (Sm). The Eu and Sm-activated lanthanum oxysulfide phosphor is a red phosphor which absorbs ultraviolet to blue light emitted from an LED chip and emits red light. Eu is an activator to heighten a light emission efficiency of the lanthanum oxysulfide as the phosphor host, and it is preferable that Eu is contained by being substituted for part of La in a range of 0.074 to 0.29 mol. If a substitution amount of Eu for La is less than a lower limit value, a sufficient luminance cannot be obtained. On the other hand, if the substitution amount of Eu for La exceeds an upper limit value, the luminance is reduced due to concentration quenching or the like.

Sm functions as an activator and, in addition, has an action to shift an excitation spectrum of a phosphor whose host is a lanthanum oxysulfide to a long-wavelength side. Thereby, an absorbency of a long-wavelength ultraviolet to blue light of a wavelength of 395 to 405 nm, for example, is improved, and a light emission efficiency at a time of excitation by such light can be improved. In order to obtain such an effect, it is preferable that Sm is contained by being substituted for part of La in a range of 0.001 to 0.006 mol. If a substitution amount of Sm for La is less than a lower limit value, sufficient luminance cannot be obtained. On the other hand, if the substitution amount of Sm for La exceeds an upper limit value, the luminance is reduced on the contrary, due to an impurity effect.

Note that with regard to the lanthanum oxysulfide being the phosphor host, part of lanthanum (La) can be replaced by at least one element selected from yttrium (Y) and gadolinium (Gd), more specifically, by any one of Y, Gd, Y+Gd. Y and Gd exhibit an effect of heightening a light emission energy in a red color region by forming (solid-solving) a solid solution in a phosphor. However, if a substitution amount of Y or Gd for La is too large, a distortion of a crystal cannot be ignored and a light emission intensity is reduced on the contrary, and thus it is preferable that the substitution amount of Y or Gd is equal to or less than 30 mol % of La.

It is preferable that the Eu and Sm-activated lanthanum oxysulfide phosphor is a red phosphor which absorbs ultraviolet to blue light emitted from an LED chip and emits red light, the red phosphor having a composition represented by a general formula:

$$(La_{2-x-y}Eu_xSm_y)O_2S \quad (2)$$

wherein x and y are numerals (atomic ratio) satisfying $0.074 \leq x \leq 0.29$ and $0.001 \leq y \leq 0.006$.

As the zinc sulfide phosphor, there is cited a phosphor whose main body (phosphor host) is a zinc sulfide (ZnS), the phosphor host being activated with copper (Cu) and aluminum (Al), or a phosphor being activated with silver (Ag) and aluminum (Al). The Cu and Al-activated zinc sulfide phosphor is a green phosphor which absorbs ultraviolet to blue light emitted from an LED chip and emits green light. The Ag and Al-activated zinc sulfide phosphor is a blue phosphor which absorbs ultraviolet to blue light emitted from an LED chip and emits blue light.

In the Cu and Al-activated zinc sulfide phosphor, Cu is an activator (main activator) being a light emission center, and it is preferable that Cu is contained by being substituted for part of Zn in a range of 0.007 to 0.024 mol %. If a substitution amount of Cu for Zn is less than a lower limit value or exceeds an upper limit value, an emission luminance or an emission chromaticity is reduced in either case. Al is an activator (coactivator) excited by ultraviolet to blue light and an emission luminance of the zinc sulfide phosphor can be heightened as a result that the main activator is made to emit by an excitation energy of such a coactivator. It is preferable that Al is contained by being substituted for part of Zn in a range of 0.012 to 0.04 mol %. If a substitution amount of Al for Zn is less than a lower limit value or exceeds an upper limit value, an emission luminance or an emission chromaticity is reduced in either case.

It is preferable that the Cu and Al-activated zinc sulfide phosphor is a green phosphor which absorbs ultraviolet to blue light emitted from an LED chip and emits green light, the green phosphor having a composition represented by a general formula:

$$(Zn_{1-x-y}Cu_xAl_y)S \quad (3)$$

wherein x and y are numerals (atomic ratio) satisfying $0.00007 \leq x \leq 0.00024$ and $0.00012 \leq y \leq 0.0004$.

In the Ag and Al-activated zinc sulfide phosphor, Ag is an activator (main activator) being a light emission center, and it is preferable that Ag is contained by being substituted for part of Zn in a range of 0.034 to 0.06 mol %. If a substitution amount of Ag for Zn is less than a lower limit value or exceeds an upper limit value, an emission luminance or an emission chromaticity is reduced in either case. Al is an activator (coactivator) excited by ultraviolet to blue light and an emission luminance of the zinc sulfide phosphor can be heightened as a result that the main activator is made to emit by an excitation energy of such a coactivator. It is preferable that Al is contained by being substituted for part of Zn in a range of 0.04 to 0.07 mol %. If a substitution amount of Al for Zn is less than a lower limit value or exceeds an upper limit value, an emission luminance or an emission chromaticity is reduced in either case.

It is preferable that the Ag and Al-activated zinc sulfide phosphor is a blue phosphor which absorbs ultraviolet to blue light emitted from an LED chip and emits blue light, the blue phosphor having a composition represented by a general formula:

$$(Zn_{1-x-y}Ag_xAl_y)S \quad (4)$$

wherein x and y are numerals (atomic ratio) satisfying $0.00034 \leq x \leq 0.0006$ and $0.0004 \leq y \leq 0.0007$.

Methods for manufacturing the aforementioned alkaline earth silicate phosphor, lanthanum oxysulfide phosphor, and zinc sulfide phosphor are not limited in particular, but manufacturing can be done by various known manufacturing methods. As an example thereof, a method for manufacturing an Eu and Mn-activated alkaline earth silicate ((Sr, Ba, Ca)$_2$SiO$_4$:Eu,Mn) phosphor will be described below. First, phosphor materials containing elements constituting a host of the phosphor and an activator as well as their chemical compounds are weighed to have a desired phosphor composition ((Sr$_{2-x-y-z-u}$Ba$_x$Mg$_y$Eu$_z$Mn$_u$)SiO$_4$), and an ammonium chloride or the like is added as a flux as necessary, and the above are mixed by a dry method.

Specifically, a strontium oxide, a barium oxide, a magnesium oxide, and a silicon dioxide are mixed at a predetermined ratio, and, proper amounts of europium oxide as an activator and of manganese oxide as a coactivator are added. A proper amount of flux is added as necessary, and phosphor materials are prepared. It is possible to use a carbonate such as a strontium carbonate, a barium carbonate, and a magnesium carbonate as materials instead of the strontium oxide, the barium oxide, and the magnesium oxide. As the activator, an europium oxalate or an europium carbonate, or the like can be used, and as the coactivator, a manganese carbonate, a manganese oxalate, or the like can be used.

Next, the above-described phosphor materials, after being filled together with activated carbon into a heat-proof container such as an alumina crucible, are burned in a reducing atmosphere (atmosphere of 3 to 10% of hydrogen, remaining being nitrogen, for example). It is preferable that a burning condition is 1100 to 1400° C.×2 to 8 hours in order to control a crystal structure of a phosphor host ((Sr, Ba, Mg)$_2$SiO$_4$). After burning, it is preferable that the phosphor materials are cooled in an atmosphere the same as the atmosphere for burning. Thereafter, an obtained burned product is wet-cleaned with ion-exchange water after a grinding process, and dried, thereafter sieving or the like for removing a coarse particle being performed as necessary, and thereby an Eu and Mn-activated alkaline earth silicate phosphor can be obtained.

Further, baking of the phosphor materials can be performed by using a rotary heating furnace as described below. That is, the above-described phosphor materials are fed into a rotatable tube-shaped heating furnace which is disposed to be inclined to a horizontal direction, and are made to pass continuously. Then, the phosphor materials are rapidly heated to a predetermined baking temperature in the heating furnace and made to move from upward to downward in the furnace while being made to roll in accordance with a rotation of the heating furnace. In this way, the phosphor materials are heated and burned for a necessary and sufficient time. Thereafter, the burned product is continuously discharged from the heating furnace, and the discharged burned product is rapidly cooled.

In such a burning process, it is preferable that the inside of the tube-shaped heating furnace and a cooling section for the burned product discharged from the heating furnace are kept in an anoxic state in which oxygen is removed, and it is desirable that the inside of the heating furnace in particular is kept in an inert gas atmosphere such as argon or nitrogen, or in a reducing gas atmosphere including hydrogen. According to such a burning method, the phosphor materials are rapidly heated while rolling in a process of moving inside the heating furnace and uniform heat energy is applied to the phosphor materials in the anoxic state, and thus burning can be completed in a shorter time compared with a conventional burning method using a crucible.

Therefore, a phosphor excellent in a luminance property can be obtained efficiently. Further, since aggregation of the phosphor particles can be suppressed, further grinding after burning is unnecessary. Thus, it is possible to suppress deterioration of a phosphor due to repetition of grinding processes. Further, since heating and burning are performed while phosphor materials are rolling inside a heating furnace, phosphor particles having a shape close to a sphere and a uniform particle diameter can be obtained. Thereby, it becomes possible to fabricate an Eu and Mn-activated alkaline earth silicate phosphor excellent in a property at a low cost.

A phosphor particle composed of at least one selected from the aforementioned alkaline earth silicate phosphor, lanthanum oxysulfide phosphor, and zinc sulfide phosphor is inferior in a weather resistance by itself. Thus, a surface of the phosphor particle made of the above-described phosphor is covered with a surface treatment agent of at least one selected from a silane coupling agent and an acrylic emulsion. Thereby, the weather resistance of the phosphor particle can be improved. In other words, it is possible to suppress reduction of an emission luminance of the phosphor particle due to moisture. It is possible to suppress deterioration or coloring of the phosphor particle under a high-temperature/high-humidity environment and reduction of the emission luminance brought about thereby.

It is preferable that the silane coupling agent as the surface treatment agent is at least one selected from an epoxy group-containing silane coupling agent and an amino group-containing silane coupling agent. By covering a surface of a phosphor particle with a film of such a silane coupling agent, a weather resistance of the phosphor particle under a high-temperature/high-humidity is improved, so that it becomes possible to suppress luminance reduction over time effectively. However, since the silane coupling agent itself is a non-light emitting component, covering with an excessive amount causes reduction of an emission luminance. It is preferable that the silane coupling agent is added in a range of 1 to 40 mass % in relation to a phosphor particle.

As the epoxy group-containing silane coupling agent, there are cited, 3-glycidoxypropylmethyldimethoxysilane, 3-glycidoxypropyltrimethoxysilane, 3-glycidoxypropylmethyldiethoxysilane 3-glycidoxypropyltriethoxysilane, and so on. As the amino group silane coupling agent there are cited, for example, N-2-(aminoethyl)-3-aminopropylmethyldimethoxysilane, N-2-(aminoethyl)-3-aminopropyltrimethoxysilane, N-2-(aminoethyl)-3-aminopropyltriethoxysilane, and 3-aminopropyltrimethoxysilane, 3-aminopropyltriethoxysilane.

It is preferable that the acrylic emulsion as the surface treatment agent is an alkalescent acrylic emulsion, and it is more preferable that the acrylic emulsion as the surface treatment agent has a composition of an acrylic/styrene system. By covering a surface of a phosphor particle with a film of such an acrylic emulsion, a weather resistance of the phosphor particle under a high-temperature/high-humidity is improved, so that it becomes possible to suppress luminance reduction over time effectively. However, since the acrylic emulsion itself is a non-light emitting component, covering with an excessive amount causes reduction of an emission luminance of the phosphor particle. Thus, it is preferable that the acrylic emulsion is added in a range of 0.05 to 5 mass % in relation to a phosphor particle.

As a result of covering the surface of the phosphor particle constituted by at least one selected from the alkaline earth silicate phosphor, the lanthanum oxysulfide phosphor, and the zinc sulfide phosphor with the film made of the aforementioned silane coupling agent or acrylic emulsion, the weather resistance of the phosphor particle can be improved. It is possible to make a luminance maintenance ratio represented by the following formula (5) 98% or more, and further 99% or more.

$$\text{Luminance } B/\text{Luminance } A \times 100(\%) \qquad (5)$$

The luminance A is an initial luminance obtained by making a phosphor emit under a condition of a temperature of 23° C. and a humidity of 40%, and the luminance B is a luminance obtained by making a phosphor emit under a condition of a temperature of 23° C. and a humidity of 40% after leaving the phosphor under a condition of a temperature of 60° C. and a humidity of 90% for 12 hours.

By making the luminance maintenance ratio of the phosphor particle composed of at least one selected from the alkaline earth silicate phosphor, the lanthanum oxysulfide phosphor, and the zinc sulfide phosphor under a high-temperature/high-humidity equal to or more than 98%, it becomes possible to maintain a luminance of a light emitting device using the phosphor particle, such as a white LED lamp and a single color LED lamp for a long period. In other words, it is possible to provide a light emitting device which is excellent in an emission luminance and excellent in a maintenance ratio of such a luminance.

It is preferable that a surface treatment of the phosphor particle by the silane coupling agent or the acrylic emulsion is performed as below. First, a phosphor dispersion liquid containing a phosphor particle constituted by at least one selected from an alkaline earth silicate phosphor, a lanthanum oxysulfide phosphor, and a zinc sulfide phosphor is prepared. It is preferable that the phosphor dispersion liquid is prepared by dispersing a phosphor powder in an alcohol aqueous solution. At least one of surface treatment agent selected from a silane coupling agent and an acrylic emulsion is fed into such a phosphor dispersion liquid.

When the silane coupling agent is used as the surface treatment agent, it is preferable to feed the silane coupling agent in a range of 0.1 to 40 mass % in relation to the phosphor particle. If a feed amount of the silane coupling agent in relation to the phosphor particle is less than 0.1 mass %, a covering amount with the silane coupling agent is lacking, so that an improvement effect of the weather resistance of the phosphor particle cannot be obtained sufficiently. On the other hand, if the feed amount of the silane coupling agent in relation to the phosphor particle exceeds 40 mass %, reduction of the emission luminance of the phosphor particle becomes prominent. It is more preferable that the feed amount of the silane coupling agent in relation to the phosphor particle is in a range of 2 to 25 mass %.

When the acrylic emulsion is used as the surface treatment agent, it is preferable that the acrylic emulsion is fed in a range of 0.05 to 5 mass % in relation to the phosphor particle. If a feed amount of the acrylic emulsion in relation to the phosphor particle is less than 0.05 mass %, a covering amount by the acrylic emulsion is lacking, so that an improvement effect of the weather resistance of the phosphor particle cannot be obtained sufficiently. If the feed amount of the acrylic emulsion in relation to the phosphor particle exceeds 5 mass %, reduction of the emission luminance of the phosphor particle becomes prominent. It is more preferable that the feed amount of the acrylic emulsion in relation to the phosphor particle is in a range of 0.1 to 3 mass %.

Next, the phosphor dispersion liquid into which the surface treatment agent has been fed is mixed by stirring. When the silane coupling agent is used as the surface treatment agent, it is preferable that a temperature of the phosphor dispersion liquid is kept at 25 to 70° C. Further, it is preferable that a mixing time of the phosphor dispersion liquid is set for 30 to 120 minutes. When the acrylic emulsion is used as the surface treatment agent, it is preferable that the temperature of the phosphor dispersion liquid is kept at 25 to 40° C. Further, it is preferable that a mixing time of the phosphor dispersion liquid is set for 30 to 120 minutes. By performing such a treatment, it is possible to perform a uniform covering treatment of the surface of the phosphor particle with the silane coupling agent or the acrylic emulsion.

Thereafter, the phosphor dispersion liquid after a mixing treatment is filtrated and the phosphor particle having been treated with the surface treatment agent is separated. Then, by drying the phosphor particle having been filtrated and separated, it is possible to obtain a phosphor for light emitting device in which a surface of the phosphor particle is uniformly covered with the silane coupling agent or the acrylic emulsion. On the surface of the phosphor particle is formed a film of an amount corresponding to a feed amount (charge amount) of the silane coupling agent or the acrylic emulsion. Therefore, it becomes possible to obtain a phosphor for light emitting device which has a good emission luminance and is excellent in a weather resistance.

Next, an embodiment of a light emitting device using the phosphor of the aforementioned embodiment will be described. The light emitting device of the embodiment has an LED chip emitting ultraviolet to blue light and a phosphor layer containing a phosphor which absorbs the ultraviolet to blue light emitted from the LED chip and emits visible light. As such a light emitting device, there are cited a white LED lamp made by combining an LED chip emitting blue light, a green to yellow phosphor, and a red phosphor, and a white LED lamp made by combining an LED chip emitting ultraviolet to violet light and a mixed phosphor (BGR or BYR phosphor) of blue, green to yellow, and red phosphors. The light emitting device of the embodiment can be a single color LED lamp.

In the light emitting device of this embodiment, the phosphor layer contains at least the phosphor of the aforementioned embodiment. In other words, the phosphor layer contains at least one selected from the Eu and Mn-activated alkaline earth silicate phosphor emitting green to yellow light, the Eu and Sm-activated lanthanum oxysulfide phosphor emitting red light, the Cu and Al-activated zinc sulfide phosphor emitting green light, and the Ag and Al-activated zinc sulfide phosphor emitting blue light. A phosphor other than the above is selected appropriately based on a configuration (an emission color of a lamp, an emission wavelength of an LED chip, a combination of phosphors, etc.) of an LED lamp, and is not particularly limited.

The light emitting device of this embodiment exhibits an excellent weather resistance based on the phosphor of the aforementioned embodiment and is excellent in a luminance maintenance ratio under a high-temperature/high-humidity environment. More specifically, it is possible to make a luminance maintenance ratio represented by the following formula (6) 95% or more, and further 98% or more.

$$\text{Luminance } D/\text{Luminance } C \times 100(\%) \tag{6}$$

The luminance C is an initial luminance obtained by making a light emitting device emit under a condition of a temperature of 23° C. and a humidity of 40%, while the luminance D is a luminance after making a light emitting device emit under a condition of a temperature of 60° C. and a humidity of 90% for 1000 hours.

Next, concrete configurations of the light emitting devices of the embodiment will be described with reference to FIG. 1 to FIG. 3. FIG. 1 is a cross-sectional view showing an LED lamp according to a first embodiment. An LED lamp 1 shown in FIG. 1 has an LED chip 2 as an excitation source of a phosphor. The LED chip 2 is mounted on a wiring substrate 4 having a pair of lead terminals 3A, 3B. A lower electrode of the LED chip 2 is electrically and mechanically connected to the lead terminal 3A. An upper electrode of the LED chip 2 is electrically connected to the lead terminal 3B via a bonding wire 5.

A cylindrical resin frame 6 is provided on the wiring substrate 4, and a reflection layer 7 is formed on an inner wall surface 6a thereof. A transparent resin 8 is filled in the resin frame 6, and the LED chip 2 is embedded in the transparent resin 8. As the transparent resin 8, a silicone resin or an epoxy resin, for example, is used. A phosphor 9 is dispersed in the transparent resin 8 in which the LED chip 2 is embedded. The transparent resin 8 and the phosphor 9 dispersed therein constitute a phosphor layer 10 which functions as a light emitting layer.

The phosphor 9 dispersed in the transparent resin 8 is excited by ultraviolet to blue light emitted from the LED chip 2 and emits visible light. An electric energy applied to the white LED lamp 1 is converted into ultraviolet to blue light in the LED chip 2 and the light is converted into light of a longer wavelength in the phosphor 9 dispersed in the transparent resin 8. Then, as a result that the light emitted from the LED chip 2 and light emission from the phosphor 9 are mixed, or light emission from a plurality of phosphors 9 are mixed, desired white light or the like is discharged from the LED lamp 1.

Figure 2:
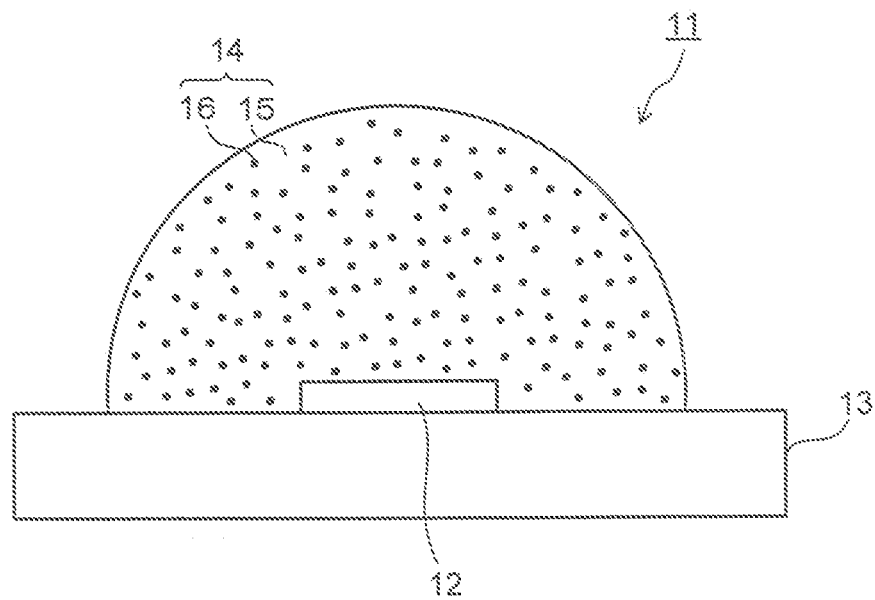
FIG. 2 is a cross-sectional view showing a light emitting device according to a second embodiment.

FIG. 2 is a cross-sectional view showing an LED lamp according to a second embodiment. An LED lamp 11 shown in FIG. 2 has an LED chip 12 as an excitation source of a phosphor. The LED chip 12 is mounted on a substrate 13. Though illustration is omitted in FIG. 2, the substrate 13 has a wiring network (not shown) provided in a surface (inside as necessary) thereof, and a wiring substrate is constituted thereby. The surface of the substrate 13 is provided with first and second electrodes based on the wiring network. An electrode (not shown) of the LED chip 12 is electrically connected to the not-shown wiring network (including the electrode) of the substrate 13.

The LED chip 12 mounted on the substrate 13 is covered with a phosphor layer 14. The phosphor layer 14 has a transparent resin layer 15 provided to cover an upper surface and a side surface of the LED chip 12 and a phosphor 16 dispersed in the transparent resin layer 15. The phosphor layer 14 has the phosphor 16 excited by light emitted from the LED chip 12 and emitting desired visible light. An electric energy applied to the LED lamp 11 is converted into light of a desired wavelength in the LED chip 12, further converted into light of a longer wavelength in the phosphor 16, and then discharged.

Figure 3:
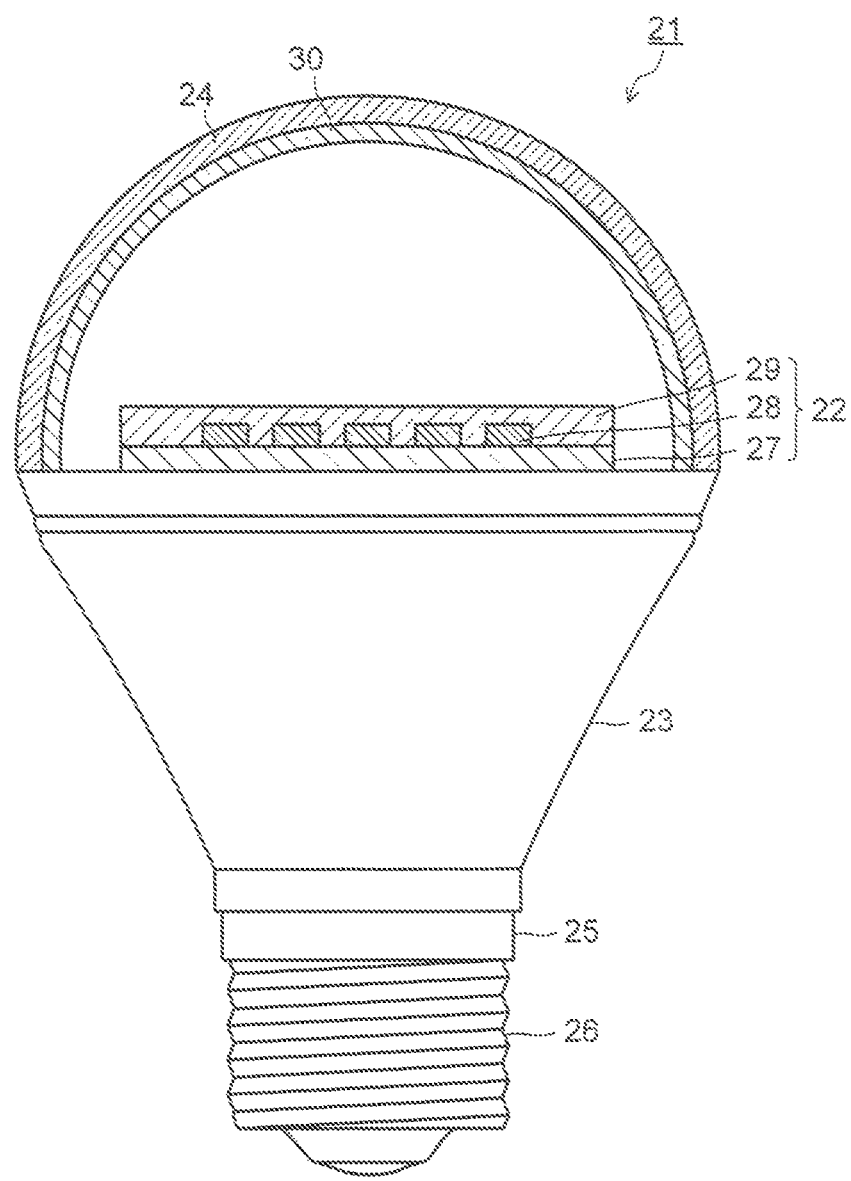
FIG. 3 is a cross-sectional view showing a light emitting device according to a third embodiment.

FIG. 3 is a cross-sectional view showing a configuration of an LED lamp (LED light bulb) according to a third embodiment. An LED lamp 21 shown in FIG. 3 is an LED light bulb having an LED module 22 as an excitation source of a phosphor. The LED light bulb 21 has the LED module 22, a base portion 23 on which the LED module 22 is disposed, a globe 24 attached on the base portion 23 in a manner to cover the LED module 22, a base 26 attached to a lower end portion of the base portion 23 via an insulating member 25, and a lighting circuit (not shown) provided inside the base portion 23.

The LED module 22 has a plurality of LED chips 28 mounted on a substrate 27. The plural LED chips 28 are surface-mounted on the substrate 27. The plural LED chips 28 are covered with a transparent resin 29 such as a silicone resin. A surface (further, inside as necessary) of the substrate 27 is provided with a wiring network (not shown), and an electrode (not shown) of the LED chip 28 is electrically connected to the wiring network of the substrate 27. A wiring whose illustration is omitted is drawn to a side surface or a bottom surface of the LED module 22, and the wiring is electrically connected to the lighting circuit (not shown) provided inside the base portion 23. The LED chip 28 is lighted by a direct-current voltage applied via the lighting circuit.

The globe 24 is made of a light transmissive member, and a glass globe 24 or a resin globe 24 having a light transmission property, for example, is used. The globe 24 has a size equal to that of an incandescent lamp, for example. An inner surface of the globe 24 is provided with a phosphor layer (phosphor film) 30 which absorbs ultraviolet to blue light emitted from the LED chip 28 and emits visible light. The phosphor layer 30 is provided in the inner surface of the globe 24 in a manner to be set apart from the LED chip 28. An electric energy applied to the LED light bulb 21 is converted into ultraviolet to blue light in the LED chip 28, further converted into light of a longer wavelength in the phosphor layer 30, and then discharged.

In the aforementioned LED lamps 1, 11, 21, the phosphors constituting the phosphor layers 10, 14, 30 are selected based on emission colors of the LED lamps 1, 11, 21 and emission wavelengths of the LED chips 2, 12, 28. For example, when an LED lamp emitting white light is constituted by using an LED chip radiating blue light with a peak wavelength of 445 to 455 nm, a green to yellow phosphor and a red phosphor are used. As the green to yellow phosphor, the Eu and Mn-activated alkaline earth silicate phosphor and the Cu and Al-activated zinc sulfide phosphor of the embodiment are exemplified. As the red phosphor, the Eu and Sm-activated lanthanum oxysulfide phosphor of the embodiment is exemplified.

When an LED lamp emitting white light is constituted by using an LED chip radiating ultraviolet to violet light with a peak wavelength of 360 to 440 nm, a blue phosphor, a green to yellow phosphor, and a red phosphor are used. As the blue phosphor, the Ag and Al-activated zinc sulfide phosphor of the embodiment is exemplified. As the green to yellow phosphor, the Eu and Mn-activated alkaline earth silicate phosphor and Cu and Al-activated zinc sulfide phosphor of the embodiment are exemplified. As the red phosphor, the Eu and Sm-activated lanthanum oxysulfide phosphor of the embodiment is exemplified. The LED lamps 1, 11, 21 are not limited to white lamps but can be single color lamps.

Note that the phosphor layer in the LED lamp of the embodiment contains at least one of the phosphors of the aforementioned embodiment, and can contain a phosphor other than the phosphor of the embodiment. Cited as such a phosphor are a blue phosphor such as an europium (Eu)-activated alkaline earth chlorophosphate phosphor, a green to yellow phosphor such as an europium (Eu) and manganese (Mn)-activated alkaline earth aluminate phosphor, or an europium (Eu)-activated sialon phosphor, and a red phosphor such as an europium (Eu)-activated cousin phosphor or an europium (Eu)-activated sulfide phosphor. It is possible that a phosphor having an emission color other than the above, a blue green phosphor, a crimson red phosphor, or the like, for example, is contained in the phosphor layer.

EXAMPLES

Next, concrete examples of the present invention and evaluation results thereof will be described.

Examples 1 to 10

First, Eu and Mn-activated alkaline earth silicate phosphors are fabricated, and properties of phosphor powders thereof and single color lamps using the phosphor powder, the single color lamps emitting green to yellow light, are evaluated.

Materials containing elements constituting a phosphor host and an activator or a chemical compound thereof are weighed based on a composition shown in Table 1, with an Mg amount and an Mn amount being constant and an Sr amount, a Ba amount, and an Eu amount being varied so that an emission color becomes in a green color region to a yellow color region. Next, an ammonium chloride is added to the phosphor materials as a flux and mixed sufficiently. A proper amount of activated carbon is added to the obtained phosphor materials and the phosphor materials are filled in an alumina crucible, being burned in a reducing atmosphere (atmosphere of 3 to 10% of hydrogen, remaining being nitrogen) under a condition of 1200° C.×5 hours. An obtained burned product is ground and sieved, and further burned under a condition of 1250° C.×5 hours. Thereafter, as a result that an obtained burned product is ground, sieved, water-cleaned, dried, and sieved, an Eu and Mn-activated alkaline earth silicate ((Sr, Ba, Mg)$_2$SiO$_4$:Eu,Mn) phosphor is obtained.

TABLE 1

| | Phosphor Composition | | | | | | Emission |
|---|---|---|---|---|---|---|---|
| | Sr | Ba(x) | Mg(y) | Eu(z) | Mn(u) | Si | Color |
| Example 1 | 0.050 | 1.650 | 0.047 | 0.250 | 0.003 | 1.0 | Green |
| Example 2 | 1.080 | 0.670 | 0.047 | 0.200 | 0.003 | 1.0 | Yellow |
| Example 3 | 0.200 | 1.550 | 0.047 | 0.200 | 0.003 | 1.0 | Green |
| Example 4 | 1.250 | 0.600 | 0.047 | 0.150 | 0.003 | 1.0 | Yellow |

TABLE 1-continued

| | Phosphor Composition | | | | | | Emission |
|---|---|---|---|---|---|---|---|
| | Sr | Ba(x) | Mg(y) | Eu(z) | Mn(u) | Si | Color |
| Example 5 | 0.369 | 1.431 | 0.047 | 0.150 | 0.003 | 1.0 | Green |
| Example 6 | 1.280 | 0.520 | 0.047 | 0.150 | 0.003 | 1.0 | Yellow |
| Example 7 | 0.625 | 1.225 | 0.047 | 0.100 | 0.003 | 1.0 | Green |
| Example 8 | 1.530 | 0.320 | 0.047 | 0.100 | 0.003 | 1.0 | Yellow |
| Example 9 | 0.810 | 0.890 | 0.047 | 0.250 | 0.003 | 1.0 | Green |
| Example 10 | 1.695 | 0.205 | 0.047 | 0.050 | 0.003 | 1.0 | Yellow |

The phosphor powders obtained as above of the examples 1 to 10 are dispersed in mixed liquids of water and ethylalcohol to prepare phosphor dispersion liquids. Next, a silane coupling agent (manufactured by Shin-Etsu Chemical Co., Ltd.) or an acrylic emulsion (manufactured by TOYO INK CO., LTD.) is fed into each phosphor dispersion liquid, under conditions shown in Table 2 and Table 3. A temperature of the phosphor dispersion liquid is set at 35° C., and stirring is done for 90 minutes after feeding of the silane coupling agent or the acrylic emulsion. Subsequently, by performing filtration, drying, and sieving, a phosphor powder is each fabricated in which a surface of a phosphor particle is uniformly covered by the silane coupling agent or the acrylic emulsion.

TABLE 2

| | Silane Coupling Agent (product name) | Added Amount (mass %) |
|---|---|---|
| Example 1 | N-2-(aminoethyl)-3-aminopropylmethyldimethoxysilane (KBM-602) | 1 |
| Example 2 | 3- glycidoxypropylmethyldiethoxysilane (KBE-402) | 10 |
| Example 3 | 3-aminopropyltriethoxysilane (KBE-903) | 3 |
| Example 4 | N-2-(aminoethyl)-3-aminopropyltrimethoxysilane (KBM-603) | 20 |
| Example 5 | N-2-(aminoethyl)-3-aminopropyltriethoxysilane (KBE-603) | 5 |
| Example 6 | 3-glycidoxypropyltriethoxysilane (KBE-403) | 40 |

TABLE 3

| | Acrylic Emulsion | | | Added |
|---|---|---|---|---|
| | Composition (product name) | pH | Viscosity (mPa · s) | Amount (mass %) |
| Example 7 | acrylic/styrene (TOCRYL X-4338) | 8.0 | 500> | 0.05 |
| Example 8 | acrylic/styrene (NANOCROSS BCX9620-1) | 8.5 | 2000 | 2.5 |
| Example 9 | acrylic/styrene (NANOCRYL BCX3799R) | 8.5 | 13 | 0.5 |
| Example 10 | acrylic/styrene (TOCRYL NPX-6160) | 8.5 | 80 | 5 |

Next, the above-described phosphor powders are each weighed in a 50 ml beaker by 5 g, and let stand in a high-temperature/high-humidity tank of a high-temperature/high-humidity atmosphere (temperature: 60° C., humidity: 90%) for 12 hours, to perform a forced weather resistance test. By using the phosphor powder subjected to the forced resistance test and the phosphor powder not subjected thereto, green to yellow LED lamps are each fabricated as described below. First, the phosphor powder is mixed into a mixed liquid of an epoxy resin and an acid anhydride curing agent, and the above is dropped on an LED chip (0.4 mm square) emitting blue light by using a dispenser, and after the epoxy resin is cured, a transparent epoxy resin cap of a semispherical shape is laid thereon, so that an LED lamp is fabricated.

As described above, by using the phosphor powder of each example, an LED lamp (measuring lamp of a luminance B/LED lamp B) using the phosphor powder subjected to the forced weather resistance test and an LED lamp (measuring lamp of a luminance A/LED lamp A) using the phosphor powder not subjected to the forced weather resistance test are fabricated. These LED lamps are made to emit under a condition of a temperature of 23° C. and a humidity of 40%, and a luminance B of the LED lamp B and the luminance A (initial luminance) of the LED lamp A are measured. Further, a luminance maintenance ratio is calculated from the luminance B and the luminance A based on the aforementioned formula (5). Further, existence/absence of color change of the phosphor due to the forced weather resistance test is investigated. Those measured results are shown in Table 4. The measurement is performed to evaluate a property of the phosphor powder.

Next, by using the phosphor powder (phosphor powder not subjected to the forced weather resistance test) of each example, an LED lamp (measuring lamp of a luminance C and a luminance D) is fabricated similarly to the above. This LED lamp is made to emit under a condition of a temperature of 23° C. and a humidity of 40%, and the luminance C (initial luminance) is measured. Next, the luminance D after the LED lamp is made to light under a high-temperature/high-humidity atmosphere (temperature: 60° C., humidity: 90%) for 1000 hours is measured. Further, a luminance maintenance ratio of the LED lamp is calculated from the luminance D and the luminance C based on the aforementioned formula (6). Measured results thereof are shown in Table 5. This measurement is performed to evaluate a property of the LED lamp.

Comparative Examples 1 to 10

Eu and Mn-activated alkaline earth silicate ((Sr, Ba, Mg)$_2$SiO$_4$:Eu,Mn) phosphors of the same composition are fabricated similarly to in the examples 1 to 10 except that a surface treatment by a silane coupling agent or an acrylic emulsion is not performed. By using phosphor powders thereof, measurements of a luminance A and a luminance B and further measurements of a luminance C and a luminance D are performed similarly to in the examples. A luminance maintenance ratio (B/A) of the phosphor powder and a luminance maintenance ratio (D/C) of an LED lamp are calculated from those measured results. Results thereof and existence/absence of color change of the phosphor due to a forced weather resistance test are shown in Table 4 and Table 5. Note that the initial luminances A, C of the examples in Table 4 and Table 5 are indicated by relative values at a time that initial luminances A, C of the comparative examples using the phosphors of the same composition are each set at 100%.

TABLE 4

| | Emission color | Content of surface treatment (kind) | Initial luminance A (%) | Luminance maintenance ratio (B/A) [60° C., 90%, 12 h] (%) | Body color change |
|---|---|---|---|---|---|
| E1 | Green | silane coupling agent | 99.8 | 99.5 | No |
| CE1 | Green | (none) | 100.0 | 97.8 | No |
| E2 | Yellow | silane coupling agent | 99.0 | 99.7 | No |

TABLE 4-continued

| | Emission color | Content of surface treatment (kind) | Initial luminance A (%) | Luminance maintenance ratio (B/A) [60° C., 90%, 12 h] (%) | Body color change |
|---|---|---|---|---|---|
| CE2 | Yellow | (none) | 100.0 | 93.3 | Yes (whitened) |
| E3 | Green | silane coupling agent | 99.6 | 99.6 | No |
| CE3 | Green | (none) | 100.0 | 97.0 | No |
| E4 | Yellow | silane coupling agent | 100.0 | 99.1 | No |
| CE4 | Yellow | (none) | 100.0 | 92.8 | Yes (whitened) |
| E5 | Green | silane coupling agent | 99.7 | 100.0 | No |
| CE5 | Green | (none) | 100.0 | 93.8 | Yes (whitened) |
| E6 | Yellow | silane coupling agent | 100.0 | 98.3 | No |
| CE6 | Yellow | (none) | 100.0 | 90.6 | Yes (whitened) |
| E7 | Green | acrylic emulsion | 99.5 | 99.0 | No |
| CE7 | Green | (none) | 100.0 | 92.0 | Yes (whitened) |
| E8 | Yellow | acrylic emulsion | 98.7 | 99.4 | No |
| CE8 | Yellow | (none) | 100.0 | 86.7 | Yes (whitened) |
| E9 | Green | acrylic emulsion | 99.9 | 98.9 | No |
| CE9 | Green | (none) | 100.0 | 90.9 | Yes (whitened) |
| E10 | Yellow | acrylic emulsion | 98.6 | 100.0 | No |
| CE10 | Yellow | (none) | 100.0 | 83.0 | Yes (whitened) |

E1 to E10 = Example 1 to Example 10; CE1 to CE10 = Comparative Example 1 to Comparative Example 10

As is obvious from Table 4, the phosphor powders of the examples 1 to 10 have higher maintenance ratios of luminances also after the forced weather resistance tests under the high-temperature/high-humidity atmosphere (temperature: 60° C., humidity: 90%) compared with the phosphor powders of the comparative examples 1 to 10, though there is a slight luminance differences in the initial luminances due to the surface treatment with the silane coupling agent or the acrylic emulsion, and it is found that the phosphor powders of the examples 1 to 10 are superior in weather resistances.

Further, in the evaluations of the body color change of the phosphors, none of the phosphors of the examples subjected to the surface treatments with the silane coupling agents or the acrylic emulsions exhibits change of the body color, while some of the phosphors of the comparative examples not subjected to the surface treatments exhibit phenomena in which the body colors are whitened. As a result that the phosphors whose body colors are changed are analyzed by an X-ray diffractometer, peaks of strontium carbonates are acknowledged in all the phosphors. These are considered to be generated as a result that moisture in the high-temperature/high-humidity atmosphere and Sr of the phosphor host react, and as an Sr rate in an alkaline earth metal in a composition increases, a degree of whitening is larger, and the luminance maintenance ratio also becomes worse.

As described above, by performing a surface treatment with a silane coupling agent or an acrylic emulsion on an Eu and Mn-activated alkaline earth silicate phosphor, it becomes possible to suppress reduction of a luminance also in a case where a phosphor powder is subjected to a forced weather resistance test under a high-temperature/high-humidity atmosphere (temperature: 60° C., humidity: 90%). In other words, it becomes possible to provide an Eu and Mn-activated alkaline earth silicate phosphor excellent in a weather resistance. Note that, as is obvious from the results of the comparative examples, as an Sr rate in a composition in alkaline earth metal is higher, deterioration under a high-temperature/high-humidity is severer. Therefore, a surface treatment with a silane coupling agent or an alkaline emulsion is effective particularly to an Eu and Mn-activated alkaline earth silicate phosphor containing Sr in a range of 1 to 1.7 mol.

TABLE 5

| | Emission color | Content of surface treatment (kind) | Initial luminance C (%) | Luminance maintenance ratio (D/C) [60° C., 90%, 1000 h] (%) |
|---|---|---|---|---|
| E1 | Green | silane coupling agent | 100.1 | 99.1 |
| CE1 | Green | (none) | 100.0 | 98.8 |
| E2 | Yellow | silane coupling agent | 100.2 | 99.7 |
| CE2 | Yellow | (none) | 100.0 | 93.7 |
| E3 | Green | silane coupling agent | 100.0 | 99.0 |
| CE3 | Green | (none) | 100.0 | 95.4 |
| E4 | Yellow | silane coupling agent | 100.0 | 99.1 |
| CE4 | Yellow | (none) | 100.0 | 93.0 |
| E5 | Green | silane coupling agent | 99.9 | 98.7 |
| CE5 | Green | (none) | 100.0 | 95.1 |
| E6 | Yellow | silane coupling agent | 99.8 | 98.3 |
| CE6 | Yellow | (none) | 100.0 | 90.1 |
| E7 | Green | acrylic emulsion | 100.2 | 99.2 |
| CE7 | Green | (none) | 100.0 | 94.8 |
| E8 | Yellow | acrylic emulsion | 99.9 | 99.0 |
| CE8 | Yellow | (none) | 100.0 | 89.4 |
| E9 | Green | acrylic emulsion | 100.0 | 98.6 |
| CE9 | Green | (none) | 100.0 | 94.1 |
| E10 | Yellow | acrylic emulsion | 100.1 | 98.9 |
| CE10 | Yellow | (none) | 100.0 | 88.3 |

E1 to E10 = Example 1 to Example 10; CE1 to CE10 = Comparative Example 1 to Comparative Example 10

As is obvious from Table 5, the LED lamps emitting green to yellow light according to the example 1 to 10, compared with the LED lamps emitting green to yellow light according to the comparative examples 1 to 10, scarcely exhibit differences in initial luminances due to performance/non-performance of surface treatments with the silane coupling agents or the acrylic emulsions and further have higher maintenance ratios of luminances also after lighting tests (weather resistance tests) under a high-temperature/high-humidity atmosphere (temperature: 60° C., humidity: 90%) for 1000 hours, and it is found that the LED lamps according to the examples 1 to 10 are superior in weather resistances.

Examples 11 to 12

Next, white LED lamps are fabricated by using Eu and Mn-activated alkaline earth silicate phosphors, and properties thereof are evaluated.

In order that an emission color from the LED lamp is white, the phosphor (subjected to the surface treatment with the silane coupling agent/the phosphor emitting green light) of the example 5, the phosphor (subjected to the surface treatment with the silane coupling agent/the phosphor emitting yellow light) of the example 6, and a CaAlSiN$_3$:Eu phosphor emitting red light are mixed. By using such a mixed phosphor (GYR phosphor), the LED lamp (white LED lamp) is fabricated similarly to in the aforementioned example.

Further, in order that an emission color from the LED lamp is white, the phosphor (subjected to the surface treatment with the acrylic emulsion/the phosphor emitting green light) of the example 7, the phosphor (subjected to the surface treatment with the acrylic emulsion/the phosphor emitting yellow light) of the example 8, and a CaAlSiN$_3$:Eu phosphor emitting red light are mixed. By using such a mixed phosphor (GYR phosphor), the LED lamp (white LED lamp) is fabricated similarly to in the aforementioned example.

Next, the above-described white LED lamp is made to emit under a condition of a temperature of 23° C. and a humidity of 40% and a luminance C (initial luminance) is measured. Next, a luminance D after the white LED lamp is made to light under a high-temperature/high-humidity atmosphere (temperature: 60° C., humidity: 90%) for 1000 hours is measured. Further, a luminance maintenance ratio of the white LED lamp is calculated from the luminance D and the luminance C based on the aforementioned formula (6). The measured results thereof will be shown in Table 6.

Comparative Example 11 to 12

White LED lamps are fabricated similarly to in the examples 11 to 12 except that the phosphors of the comparative examples 5 to 6 and the phosphors of the comparative examples 7 to 8 which are not subjected to surface treatments with the silane coupling agent or the acrylic emulsion are used. By using these white LED lamps, the luminances C and the luminances D are measured similarly to in the examples, and further luminance maintenance ratios (D/C) of the white LED lamps are calculated. Results thereof are shown in Table 6. Note that an initial luminances C in Table 6 of the examples are indicated by relative values at a time that initial luminances C of the comparative examples using the phosphors of the same composition are each set at 100%.

TABLE 6

| | White LED Lamp | | |
|---|---|---|---|
| | Content of surface treatment (kind) | Initial luminance C (%) | Luminance maintenance ratio (D/C) [60° C., 90%, 1000 h] (%) |
| E11 | silane coupling agent | 99.8 | 99.1 |
| CE11 | (none) | 100.0 | 91.6 |
| E12 | acrylic emulsion | 100.0 | 98.9 |
| CE12 | (none) | 100.0 | 90.9 |

E11 to E12 = Example 11 to Example 12; CE11 to CE12 = Comparative Example 11 to Comparative Example 12

As is obvious from Table 6, the white LED lamps according to the examples 11 to 12, compared with the white LED lamps according to the comparative examples 1 to 10, scarcely exhibit differences in initial luminances due to performance/non-performance of surface treatments with the silane coupling agent or the acrylic emulsion and further have higher maintenance ratios of luminances also after lighting tests (weather resistance tests) under a high-temperature/high-humidity atmosphere (temperature: 60° C., humidity: 90%) for 1000 hours, and it is found that the LED lamps according to the examples 11 to 12 are superior in weather resistances.

Examples 13 to 18

There are evaluated properties of an Eu and Sm-activated lanthanum oxysulfide phosphor and a Cu and Al-activated zinc sulfide phosphor, and an Ag and Al-activated zinc sulfide phosphor, and properties of single color lamps using the above.

There are prepared an La$_2$O$_2$S:Eu,Sm phosphor emitting red light, a ZnS:Cu,Al phosphor emitting green light, and a ZnS:Ag,Al phosphor emitting blue light, and these phosphors are dispersed in mixed liquids of water and ethylalcohol to prepare phosphor dispersion liquids. Next, a silane coupling agent (manufactured by Shin-Etsu Chemical Co. Ltd.) or an acrylic emulsion (manufactured by TOYO INK CO., LTD.) is fed into each phosphor dispersion liquid, under a condition shown in Table 7 and Table 8. A temperature of the phosphor dispersion liquid is set at 35° C., and stirring is done for 90 minutes after feeding of the silane coupling agent or the acrylic emulsion. Subsequently, by performing filtration, drying, and sieving, phosphor powders are each fabricated in which a surface of a phosphor particle is uniformly covered with the silane coupling agent or the acrylic emulsion.

TABLE 7

| Phosphor | Silane Coupling Agent (product name) | Added Amount (mass %) |
|---|---|---|
| E13 | $La_2O_2S$: Eu,Sm phosphor | N-2-(aminoethyl)-3-aminopropylinethyldimethoxysilane (KBM-602) | 20 |
| E14 | ZnS: Cu,Al phosphor | 3-glycidoxypropylmethyldiethoxysilane (KBE-402) | 20 |
| E15 | ZnS: Ag,Al phosphor | N-2-(aminoethyl)-3-aminopropyltriethoxysilane (KBE-603) | 20 |

E13 to E15 = Example 13 to Example 15

TABLE 8

| Phosphor | Acrylic Emulsion Composition (product name) | pH | Viscosity (mPa·s) | Added Amount (mass %) |
|---|---|---|---|---|
| E16 | $La_2O_2S$: Eu,Sm phosphor | acrylic/styrene (TOCRYL X-4338) | 8.0 | 500> | 3.0 |
| E17 | ZnS: Cu,Al phosphor | acrylic/styrene (NANOCROSS BCX9620-1) | 8.5 | 2000 | 3.0 |
| E18 | ZnS: Ag,Al phosphor | acrylic/styrene (TOCRYL NPX-6160) | 8.5 | 80 | 3.0 |

E16 to E18 = Example 16 to Example 18

Next, the above-described phosphor powders are each weighed in a 50 ml beaker by 5 g, and let stand in a high-temperature/high-humidity tank of a high-temperature/high-humidity atmosphere (temperature: 60° C., humidity: 90%) for 12 hours to perform a forced weather resistance test. By using the phosphor powder subjected to the forced resistance test and the phosphor powder not subjected thereto, single color LED lamps are fabricated similarly to in the aforementioned examples. By using such single color LED lamps, measurements of a luminance A and a luminance B are performed similarly to in the aforementioned examples. Further, by using the single color LED lamp using the phosphor powder not subjected to the forced weather resistance test, measurements of a luminance C and a luminance D are performed similarly to in the aforementioned examples. A luminance maintenance ratio (B/A) of the phosphor powder and a luminance maintenance ratio (D/C) of the LED lamp are calculated from those measured results. Results thereof and existence/absence of color change of phosphors due to the forced weather resistance tests are shown in Table 9 and Table 10.

Comparative Example 13 to 18

By using phosphor powders having the compositions the same as those of the examples 13 to 18 and not subjected to surface treatments with a silane coupling agent or an acrylic emulsion, measurements of luminances A and luminances B and further measurements of luminances C and luminances D are performed similarly to in the examples. Luminance maintenance ratios (B/A) of the phosphor powder and luminance maintenance ratios (D/C) of LED lamps are calculated from those measured results. Results thereof and existence/absence of color change of phosphors due to forced weather resistance tests are shown in Table 9 and Table 10. Note that initial luminances A, C of the examples in Table 9 and Table 10 are indicated by relative values at a time that initial luminances A, C of the comparative examples using the phosphor of the same compositions are each set at 100%.

TABLE 9

| | Emission color | Content of surface treatment (kind) | Initial luminance A (%) | Luminance maintenance ratio (B/A) [60° C., 90%, 12 h] (%) | Body color change |
|---|---|---|---|---|---|
| E13 | Red | silane coupling agent | 99.9 | 99.5 | No |
| CE13 | Red | (none) | 100.0 | 95.4 | No |
| E14 | Green | silane coupling agent | 99.6 | 99.1 | No |
| CE14 | Green | (none) | 100.0 | 93.2 | No |
| E15 | Blue | silane coupling agent | 99.8 | 99.3 | No |
| CE15 | Blue | (none) | 100.0 | 92.6 | No |
| E16 | Red | acrylic emulsion | 99.8 | 99.4 | No |
| CE16 | Red | (none) | 100.0 | 96.0 | No |
| E17 | Green | acrylic emulsion | 99.7 | 99.3 | No |
| CE17 | Green | (none) | 100.0 | 93.8 | No |
| E18 | Blue | acrylic emulsion | 99.9 | 99.2 | No |
| CE18 | Blue | (none) | 100.0 | 93.0 | No |

E13 to E18 = Example 13 to Example 18; CE13 to CE18 = Comparative Example 13 to Comparative Example 18

As is obvious from Table 9, the phosphor powders of the examples 13 to 18, compared with the phosphor powders of the comparative examples 13 to 18, though exhibiting slight luminance differences in initial luminances due to surface treatments with the silane coupling agent or the acrylic emulsion, have higher maintenance ratios of luminances also after forced weather resistance tests under a high-temperature/high-humidity atmosphere (temperature: 60° C., humidity: 90%), and it is found that the LED lamps according to the examples 13 to 18 are superior in weather resistances.

TABLE 10

| | Emission color | Content of surface treatment (kind) | Initial luminance C (%) | Luminance maintenance ratio (D/C) [60° C., 90%, 1000 h] (%) |
|---|---|---|---|---|
| E13 | Red | silane coupling agent | 100.0 | 99.5 |
| CE13 | Red | (none) | 100.0 | 96.2 |
| E14 | Green | silane coupling agent | 100.1 | 99.6 |
| CE14 | Green | (none) | 100.0 | 95.2 |
| E15 | Blue | silane coupling agent | 99.8 | 99.2 |
| CE15 | Blue | (none) | 100.0 | 96.4 |
| E16 | Red | acrylic emulsion | 100.1 | 99.6 |
| CE16 | Red | (none) | 100.0 | 96.3 |
| E17 | Green | acrylic emulsion | 99.9 | 99.2 |
| CE17 | Green | (none) | 100.0 | 96.8 |
| E18 | Blue | acrylic emulsion | 100.0 | 99.5 |
| CE18 | Blue | (none) | 100.0 | 95.8 |

E13 to E18 = Example 13 to Example 18; CE13 to CE18 = Comparative Example 13 to Comparative Example 18

As is obvious from Table 10, the LED lamps according to the example 13 to 18, compared with the LED lamps according to the comparative examples 13 to 18, scarcely exhibit differences in initial luminances due to performance/non-performance of surface treatments with the silane coupling agent or the acrylic emulsion and further have higher maintenance ratios of luminances also after lighting tests (weather resistance tests) under a high-temperature/high-humidity atmosphere (temperature: 60° C., humidity: 90%) for 1000 hours, and it is found that the LED lamps according to the examples 13 to 18 are superior in weather resistances.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A phosphor for a light emitting device which has an LED chip emitting ultraviolet to blue light, comprising:
   a phosphor particle composed of an europium and manganese-activated alkaline earth silicate phosphor emitting green to yellow light, the europium and manganese-activated alkaline earth silicate phosphor having a composition represented by a general formula:

$(Sr_{2-x-y-z-u}Ba_xMg_yEu_zMn_u)SiO_4$ wherein x is a numeral (atomic ratio) satisfying $0.1 \leq x \leq 1.69$, y is a numeral (atomic ratio) satisfying $0.01 \leq y \leq 0.05$, z is a numeral (atomic ratio) satisfying $0.025 \leq z \leq 0.25$, and u is a numeral (atomic ratio) satisfying $0.001 \leq u \leq 0.01$; and
   a surface treatment agent of at least one selected from a silane coupling agent and an acrylic emulsion, the surface treatment agent being provided to cover a surface of the phosphor particle,
   wherein a luminance maintenance ratio is 98% or more, wherein the luminance maintenance ratio is represented by a formula:

luminance $B$/luminance $A \times 100(\%)$, the luminance A is an initial luminance obtained by making the phosphor emit under a condition of a temperature of 23° C. and a humidity of 40%, and the luminance B is a luminance obtained by making the phosphor emit under a condition of a temperature of 23° C. and a humidity of 40% after leaving the phosphor under a condition of a temperature of 60° C. and a humidity of 90% for 12 hours.

2. The phosphor according to claim 1,
   wherein the surface treatment agent is at least one selected from an epoxy group-containing silane coupling agent and an amino group-containing silane coupling agent.

3. The phosphor according to claim 2,
   wherein the silane coupling agent is at least one selected from N-2-(aminoethyl)-3-aminopropylmethyldimethoxysilane, N-2-(aminoethyl)-3-aminopropyltrimethoxysilane, N-2-(aminoethyl)-3-aminopropyltriethoxysilane, 3-aminopropyltrimethoxysilane, 3-aminopropyltriethoxysilane, 3-glycidoxypropylmethyldimethoxysilane, 3-glycidoxypropyltrimethoxysilane, 3-glycidoxypropylmethyldiethoxysilane, and 3-glycidoxypropyltriethoxysilane.

4. The phosphor according to claim 1,
   wherein the surface treatment agent is an alkalescent acrylic emulsion.

5. A light emitting device comprising:
   an LED chip emitting ultraviolet to blue light; and
   a phosphor layer containing a phosphor which absorbs the ultraviolet to blue light emitted from the LED chip and emits visible light,
   wherein the phosphor layer contains the phosphor according to claim 1.

6. The light emitting device according to claim 5,
   wherein a luminance maintenance ratio is 95% or more, wherein the luminance maintenance ratio is represented by a formula:

luminance $D$/luminance $C \times 100(\%)$, the luminance C is an initial luminance obtained by making the light emitting device emit under a condition of a temperature of 23° C. and a humidity of 40%, and the luminance D is a luminance after making the light emitting device emit under a condition of a temperature of 60° C. and a humidity of 90% for 1000 hours.

7. The light emitting device according to claim 5,
   wherein the LED chip emits blue light whose peak wavelength is in a range of from 445 to 455 nm;
   wherein the phosphor layer contains a green to yellow phosphor having a phosphor particle composed of an alkaline earth silicate phosphor and a red phosphor, and is excited by the blue light emitted from the LED chip to emit green to yellow light and red light by; and
   wherein white light is obtained by color mixture of the blue light emitted from the LED chip, the green to yellow light and the red light emitted from the phosphor layer.

8. The light emitting device according to claim 5,
   wherein the LED chip emits ultraviolet to violet light having peak wavelength in a range of from 360 to 440 nm;
   wherein the phosphor layer contains a blue phosphor, a green phosphor, and a red phosphor, and is emitted by the ultraviolet to violet light emitted from the LED chip to emit white light.

9. A method for manufacturing a phosphor for a light emitting device which has an LED chip emitting ultraviolet to blue light, comprising:
   feeding a surface treatment agent of a silane coupling agent into a phosphor dispersion liquid containing a phosphor particle composed of an alkaline earth silicate phosphor while keeping a temperature of the phosphor dispersion liquid at 25 to 70° C. or feeding a surface treatment agent of an acrylic emulsion into the phosphor dispersion liquid while keeping the temperature at 25 to 40° C.;
   stirring and mixing the phosphor dispersion liquid into which the surface treatment agent has been fed for 30 to 120 minutes;
   filtrating the phosphor dispersion liquid to separate the phosphor particle having been treated with the surface treatment agent; and
   drying the separated phosphor particle.

10. The manufacturing according to claim 9,
    wherein the silane coupling agent is fed in a range of from 0.1 to 40 mass % in relation to the phosphor particle.

11. The manufacturing method according to claim 9,
    wherein the acrylic emulsion is fed in a range of from 0.05 to 5 mass % in relation to the phosphor particle.

* * * * *